US009076925B2

(12) United States Patent
Nakamura et al.

(10) Patent No.: US 9,076,925 B2
(45) Date of Patent: Jul. 7, 2015

(54) THERMOELECTRIC MATERIAL, METHOD FOR PRODUCING THE SAME, AND THERMOELECTRIC CONVERSION MODULE USING THE SAME

(71) Applicant: Japan Science and Technology Agency, Kawaguchi, Saitama (JP)

(72) Inventors: Yoshiaki Nakamura, Toyonaka (JP); Masayuki Isogawa, Toyonaka (JP); Tomohiro Ueda, Toyonaka (JP); Jun Kikkawa, Tsukuba (JP); Akira Sakai, Toyonaka (JP); Hideo Hosono, Yokohama (JP)

(73) Assignee: JAPAN SCIENCE AND TECHNOLOGY AGENCY, Kawaguchi-Shi (JP)

( * ) Notice: Subject to any disclaimer, the term of this patent is extended or adjusted under 35 U.S.C. 154(b) by 0 days.

(21) Appl. No.: 14/355,598

(22) PCT Filed: May 15, 2013

(86) PCT No.: PCT/JP2013/063580
§ 371 (c)(1),
(2) Date: May 1, 2014

(87) PCT Pub. No.: WO2013/179897
PCT Pub. Date: Dec. 5, 2013

(65) Prior Publication Data
US 2014/0299172 A1    Oct. 9, 2014

(30) Foreign Application Priority Data
May 31, 2012   (JP) ................................. 2012-124940

(51) Int. Cl.
*H01L 35/16*   (2006.01)
*H01L 35/22*   (2006.01)
(Continued)

(52) U.S. Cl.
CPC ................ *H01L 35/22* (2013.01); *H01L 35/26* (2013.01); *H01L 35/12* (2013.01); *H01L 35/00* (2013.01); *H01L 35/14* (2013.01); *H01L 35/32* (2013.01); *H01L 35/34* (2013.01)

(58) Field of Classification Search
CPC ......... H01L 35/32; H01L 35/34; H01L 35/12; H01L 35/00; H01L 35/26; H01L 35/14; H01L 35/22
USPC ...................................... 136/238; 252/62.3 T
See application file for complete search history.

(56) References Cited

U.S. PATENT DOCUMENTS 6,005,342 A * 12/1999 Morton .......................... 313/486
7,309,830 B2 * 12/2007 Zhang et al. ............... 136/236.1
(Continued)

FOREIGN PATENT DOCUMENTS

JP    H05-343746 A    12/1993
JP    H10-209508 A    8/1998
(Continued)

OTHER PUBLICATIONS

The International Bureau of WIPO, "Notification Concerning Documents Transmitted: Written Opinion of the International Searching Authority," issued in International Application No. PCT/JP2013/063580, of which U.S. Appl. No. 14/355,598 is a U.S. national phase entry, with a date of mailing of Oct. 8, 2014.
(Continued)

*Primary Examiner* — Devina Pillay

(57) ABSTRACT

A thermoelectric material includes a semiconductor substrate, a semiconductor oxide film formed on the substrate, and a thermoelectric layer provided on the oxide film. The semiconductor oxide film has a first nano-opening formed therein. The thermoelectric layer has such a configuration that semiconductor nanodots are piled up on or above the first nano-opening so as to form a particle packed structure. At least some of the nanodots each have a second nano-opening formed in its surface, and are connected to each other through the second nano-opening with their crystal orientation aligned. The thermoelectric material is produced through steps of oxidizing the substrate to form the semiconductor oxide film thereon, forming the first nano-opening in the oxide film, and epitaxially growing to pile up the plurality of nanodots on the first nano-opening.
As a result, it is possible to provide the thermoelectric material superior in thermoelectric conversion performance.

12 Claims, 5 Drawing Sheets

(51) Int. Cl.

| | | |
|---|---|---|
| *H01L 35/26* | (2006.01) | |
| *H01L 35/12* | (2006.01) | |
| *H01L 35/00* | (2006.01) | |
| *H01L 35/14* | (2006.01) | |
| *H01L 35/32* | (2006.01) | |
| *H01L 35/34* | (2006.01) | |

(56) References Cited

U.S. PATENT DOCUMENTS

| | | | |
|---|---|---|---|
| 2002/0026856 | A1 | 3/2002 | Suzuki et al. |
| 2004/0150013 | A1 | 8/2004 | Ipposhi |
| 2006/0207647 | A1* | 9/2006 | Tsakalakos et al. ......... 136/256 |
| 2008/0073743 | A1* | 3/2008 | Alizadeh et al. ............. 257/461 |
| 2008/0092945 | A1* | 4/2008 | Munteanu et al. ........... 136/252 |
| 2009/0004086 | A1 | 1/2009 | Kuhling et al. |
| 2009/0314324 | A1 | 12/2009 | Murai et al. |
| 2010/0175734 | A1 | 7/2010 | Lee et al. |
| 2010/0193003 | A1 | 8/2010 | Lee et al. |

FOREIGN PATENT DOCUMENTS

| | | |
|---|---|---|
| JP | 2002-076452 A | 3/2002 |
| JP | 2005-303249 A | 10/2005 |
| JP | 2006-190773 A | 7/2006 |
| KR | 2004-0067786 A | 7/2004 |
| RU | 2 376 681 C1 | 12/2009 |
| RU | 91 476 U1 | 2/2010 |
| RU | 2 400 575 C9 | 6/2011 |
| WO | 2007/066820 A1 | 6/2007 |
| WO | 2008/140596 A2 | 11/2008 |

OTHER PUBLICATIONS

S. K. Bux et al., "Nanotstuctured Bulk Silicon as an Effective Thermoelectric Material," Advanced Functional Materials, vol. 19(15), pp. 2445-2452, (2009).

G. Gesele et al., "Temperature-Dependent Thermal Conductivity of Porous Silicon," Journal of Physics D: Applied Physics, vol. 30(21), pp. 2911-2916. (1997).

L.D. Hicks and M. S. Dresselhaus, "Thermoelectric Figure of Merit of a One-Dimensional Conductor," Physical Review B, vol. 47(24), pp. 16631-16634, (1993).

A. I. Hochbaum et al., "Enhanced Thermoelectric Performance of Rough Silicon Nanowires," Nature, vol. 451, pp. 163-167, (2008).

G. Joshi et al., "Enhanced Thermoelectric Figure-of-Merit in Nanostructured p-type Silicon Germanium Bulk Alloys," Nano Letters, vol. 8(12), pp. 4670-4674, (2008).

J. H. Lee et al., "Lattice Thermal Conductivity of Nanoporous Si: Molecular Dynamics Study," Applied Physics Letters, vol. 91(22), pp. 223110-223110-3, (2007).

H. Ohta et al., "Giant Thermoelectric Seebeck Coefficient of a Two-Dimensional Electron Gas in SrTiO3," Nature Materials, vol. 6, pp. 129-134, (2007).

G. Pernot et al., "Precise Control of Thermal Conductivity at the Nanoscale Through Individual Phonon-Scattering Barriers," Nature Materials, vol. 9, pp. 491-495, (2010).

A. A. Shklyaev and M. Ichikawa, "Visible Photoluminescence of Ge Dots Embedded in Si/SiO2 Matrices," Applied Physics Letters, vol. 80(8), pp. 1432-1434, (2002).

L.D. Hicks and M. S. Dresselhaus, "Effect of Quantum-Well Structures on the Thermoelectric Figure of Merit," Physical Review B, vol. 47(19), pp. 12727-12731, (1993).

A. A. Shklyaev et al., "High-Density Ultrasmall Epitaxial Ge Islands on Si(111) Surfaces with a SiO2 Coverage," Physical Review B, vol. 62(3), pp. 1540-1543, (2000).

A. A. Shklyaev and M. Ichikawa, "Three-Dimensional Si Islands on Si(001) Surfaces," Physical Review B, vol. 65 (4), pp. 045307-045307-6 (2001).

European Patent Office, "Supplementary European Search Report," issued in EP Patent Application No. 13 79 6323, which is a European counterpart of U.S. Appl. No. 14/355,598, with an issuance date of Nov. 10, 2014, 4 pages.

Korean Intellectual Property Office, "Notice of Allowance," issued in KR Patent Application No. 2014-7013536, which is a Korean counterpart of U.S. Appl. No. 14/355,598, with an issuance date of Nov. 3, 2014, 3 pages. (1 page of English Translation and 2 pages of Notice of Allowance).

Federal Service for Intellectual Property, Patent and Trademarks, "Decision to Grant a Patent for an Invention", received for Russian Patent Application No. 2014118878/28 (029795), which is a Russian counterpart of U.S. Appl. No. 14/355,598, issued on Feb. 3, 2015, 16 pages. (7 pages of English Translation of Decision to Grant a Patent for an Invention, 9 pages of Decision to Grant a Patent for an Invention).

* cited by examiner

THERMOELECTRIC MATERIAL, METHOD FOR PRODUCING THE SAME, AND THERMOELECTRIC CONVERSION MODULE USING THE SAME

CROSS REFERENCE TO RELATED APPLICATIONS

This patent application is a U.S. national stage application under 35 U.S.C. §371 of International Patent Application No. PCT/JP2013/063580 filed on May 15, 2013, which claims the benefit of foreign priority to Japanese Patent Application No. JP 2012-124940 filed on May 31, 2012, the disclosures of all of which are hereby incorporated by reference in their entireties. The International Application was published in Japanese on Dec. 5, 2013, as International Publication No. WO 2013/179897 A1 under PCT Article 21(2).

TECHNICAL FIELD

The present invention relates to a thermoelectric material using semiconductor nanodots, and more particularly to a thermoelectric material including nanodots made of silicon, germanium, or silicon based semiconductor, and a thermoelectric conversion module using the thermoelectric material, and a method for producing the thermoelectric material.

BACKGROUND ART

Recently, in order to reduce an environmental load, a thermoelectric conversion technique to effectively use energy has attracted attention. Thus, a high-performance thermoelectric material using a rare metal such as BiTe, PbTe, or SiGe has been conventionally developed as a thermoelectric material to be employed in the thermoelectric conversion technique using the Seebeck effect. In this case, however, since the rare metal is used, there is a problem in view of the environmental load and a risk in resources.

When thermoelectric conversion performance is to be evaluated, dimensionless performance index ZT ($=S^2\sigma T/k$) is used in general. S represents the Seebeck coefficient, $\sigma$ represents electric conductivity, k represents thermal conductivity, and T represents absolute temperature. The larger the performance index ZT is, the better the thermoelectric conversion performance is. As can be seen from the formula representing the performance index ZT, in order to improve the thermoelectric conversion performance, it is preferable to use a thermoelectric material in which the Seebeck coefficient S and the electric conductivity $\sigma$ are large, and the thermal conductivity k is small.

In order to solve the problem generated due to the use of the rare metal, it is preferable to use a thermoelectric material made of a ubiquitous element typified by Si. In the case of Si, however, the problem is that the thermal conductivity k is also large although Seebeck coefficient S and the electric conductivity $\sigma$ are sufficiently large.

Meanwhile, it is reported that the use of a material having a nanostructure as the thermoelectric material leads to the reduction of the thermal conductivity k, and further that the use of a material having a low-dimensional nanostructure leads to a quantum effect and thus to the increase of an index called power factor ($S^2\sigma$) (non-patent documents 1 to 3).

Thus, studies have been conducted to develop the high-performance thermoelectric material using the nanostructure such as nanowire, nanocomposite, or nanoporous material (non-patent document 4 to 8).

Furthermore, it is reported that the use of the material having a nanodot structure leads to the reduction of the thermal conductivity (non-patent document 9). Some attempts are made such that a nano-opening is formed in an ultrathin silicon oxide film formed on the silicon substrate, and then a nanodot island is epitaxially grown thereon to use as an optical device (non-patent documents 10 to 12). Furthermore, some attempts are made such that by use of the Stranski-Kranstranov (SK) growth, SK dot superlattice is epitaxially grown.

Similarly, patent document 1 discloses a method for producing a semiconductor optical device in which nanodots made of silicon based compound are epitaxially laminated with a space among them filled with a spacer layer made of material such as Si. Patent document 1 also implies that the device is used as a thermoelectric conversion device (paragraph [0042] etc.).

PRIOR ART DOCUMENTS

Patent Documents

Patent Document 1: JP 2005-303249 A

Non-Patent Documents

Non-patent Document 1: L. D. Hicks, et al., "Thermoelectric figure of merit of a one-dimensional conductor", Physical review B, VOL 47, NUMBER 24, 15 Jun. 1993, 16631-16634.

Non-patent Document 2: HIROMICHI OHTA, et al., "Giant thermoelectric Seebeck coefficient of a two-dimensional electron gas in SrTiO3", nature materials VOL 6, Febuary 2007, 129-134.

Non-patent Document 3: L. D. Hicks, et al., "Effect of quantum-well structures on the thermoelectric figure of merit", Physical review B, VOL 47, NUMBER 19, 15 May 1993, 12727-12731.

Non-patent Document 4: Allon I. Hochbaum, et al., "Enhanced thermoelectric performance of rough silicon nanowires", nature Letters, Vol 451, 10 Jan. 2008, 06381.

Non-patent Document 5: Sabah K. Bux, et al., "Nanostructured Bulk Silicon as an Effective Thermoelectric Material", Advanced Functional Materials 2009, 19, 2445-2452.

Non-patent Document 6: Giri Joshi, et al., "Enhanced Thermoelectric Figure-of-Merit in Nanostructured p-type Silicon Germanium Bulk Alloys", American Chemical Society NANO LETTERS 2008 Vol. 8, No. 12, 4670-4674.

Non-patent Document 7: J.-H. Lee, et al., "Lattice thermal conductivity of nanoporous Si: Molecular dynamics study", APPLIED PHYSICS LETTERS 91, 223110 2007.

Non-patent Document 8: G. Geseley, et al., "Temperature-dependent thermal conductivity of porous silicon", J. Phys. D: Appl. Phys. 30 (1997) 2911-2916.

Non-patent Document 9: G. Pernot, et al., "Precise control of thermal conductivity at the nanoscale through individual phonon-scattering barriers", NATURE MATERIALS, VOL 9, June 2010, 491-495.

Non-patent Document 10: Alexander A. Shklyaev, et al., "Visible photoluminescence of Ge dots embedded in SiO/SiO2 matrices", APPLIED PHYSICS LETTERS VOLUME 80, NUMBER 8, 25 Feb. 2002, 1432-1434.

Non-patent Document 11: Alexander A. Shklyaev, et al., "High-density ultrasmall epitaxial Ge islands on Si (111) surfaces with a SIO2 coverage", PHYSICAL REVIEW B VOLUME 62, NUMBER 3 15 Jul. 2000-I, 1540-1543.

Non-patent Document 12: Alexander A. Shklyaev, et al., "Three-dimensional Si islands on Si (001) surfaces", PHYSICAL REVIEW B VOLUME 65, 045307.

SUMMARY OF THE INVENTION

Problems to be Solved by the Invention

As described above, with the low-dimensional nanostructure, the thermoelectric material can be obtained which is superior in thermoelectric conversion efficiency. In a case of the nanowire having one-dimensional structure, however, it is difficult to use as the thermoelectric material due to its structure. In a case of the nanocomposite including the nanostructure in a thin film, controllability is low since the crystal orientation of the nanostructure, the size of the nanostructure and the distance among the nanostructures are irregular. As a result, the electrical conductivity is low, and it is difficult to use the quantum effect. In a case of the nanoporous structure, it is difficult to enhance performance with the quantum effect specific to the nanostructure. Furthermore, in a case of the SK dot superlattice technique using the epitaxial growth technique, it is difficult to reduce nanometer scales of a nanodot size and a nanodot-nanodot distance, and increase a nanodot areal density, which causes the problem that the electric conductivity is not increased so much, and causes the problem that it is difficult to improve the performance.

It is an object of the present invention to provide a thermoelectric material superior in thermoelectric conversion performance, and a method for producing the same.

Means for Solving the Problems

In order to achieve the above object, a first aspect of the present invention relates to a thermoelectric material comprising:
a semiconductor substrate;
a semiconductor oxide film formed on the semiconductor substrate; and
a thermoelectric layer provided on the semiconductor oxide film, wherein
the semiconductor oxide film has a first nano-opening (nano-window) formed therein,
the thermoelectric layer has such a configuration that a plurality of semiconductor nanodots are piled up on or above the first nano-opening so as to form a particle packed structure, and
at least some of the plurality of semiconductor nanodots each have a second nano-opening (nano-window) formed in its surface, and are connected to each other through the second nano-opening with their crystal orientation aligned.

According to the first aspect of the present invention, preferably, each of the semiconductor nanodots has a potential barrier layer provided on its surface, and
the second nano-opening is formed in the potential barrier layer.

According to the first aspect of the present invention, preferably, each of the semiconductor nanodots is made of material selected from the group consisting of Si, Ge, SiGe, silicon based compound of Mg, silicon based compound of Fe, and silicon based compound of Mn.

According to the first aspect of the present invention, preferably, the potential barrier layer is made of $SiO_2$.

According to the first aspect of the present invention, preferably, the potential barrier layer is made of Si, and has an oxide layer made of $SiO_2$ on its surface.

According to the first aspect of the present invention, preferably, each of the semiconductor nanodots has a diameter ranging from 2 nm to 50 nm.

According to the first aspect of the present invention, preferably, each of the semiconductor nanodots has an areal density of $10^{11}$ $cm^{-2}$ or more.

According to the first aspect of the present invention, preferably, the potential barrier layer has a thickness of 3 nm or less.

According to the first aspect of the present invention, preferably, each of the semiconductor nanodots contains a p-type or n-type dopant.

A second aspect of the present invention relates to a thermoelectric conversion module provided with p-type and n-type thermoelectric elements alternately arranged and electrically connected in series, wherein
the p-type and n-type thermoelectric elements each comprise the thermoelectric material according to the first aspect of the present invention, and are provided on a principal surface opposite to a principal surface of the semiconductor substrate having a semiconductor device.

A third aspect of the present invention relates to a method for producing a thermoelectric material comprising:
a preparing step of preparing a semiconductor substrate;
an oxidizing step of oxidizing the semiconductor substrate to form a semiconductor oxide film on the semiconductor substrate;
an opening step of forming a first nano-opening in the semiconductor oxide film; and
a growing step of epitaxially growing to pile up a plurality of semiconductor nanodots made of semiconductor material on the first nano-opening.

According to the third aspect of the present invention, preferably, in the growing step, a second nano-opening is formed in each of the semiconductor nanodots, and the nanodots are connected to each other through the second nano-opening.

Effects of the Invention

According to the present invention, the semiconductor nanodots are connected to each other with their crystal orientation aligned, thereby improving the electric conductivity. Furthermore, the thermal conductivity is reduced due to the structure of the nanodot itself, and the quantum effect can be obtained due to the nanostructure, thereby increasing the power factor. As a result, it is possible to provide the thermoelectric material superior in thermoelectric conversion performance, and the thermoelectric conversion module including a thermoelectric conversion element using the thermoelectric material.

BRIEF DESCRIPTION OF THE DRAWINGS

FIGS. 3A and 3B are each an illustration showing an opening step of a method for producing the thermoelectric material, in which FIG. 3A shows a state before the formation of a film opening, and FIG. 3B shows a state after the formation.

FIGS. 4A to 4C are each an illustration showing a growing step of the method for producing the thermoelectric material, in which FIG. 4A shows a step of creating a nanodot, FIG. 4B shows a step of forming a layer opening in a barrier layer, and FIG. 4C shows a step of creating a new nanodot.

EMBODIMENTS OF THE INVENTION

First Embodiment

A thermoelectric material 10 according to a first embodiment of the present invention will be described with reference to FIGS. 1 and 2.

Figure 1:
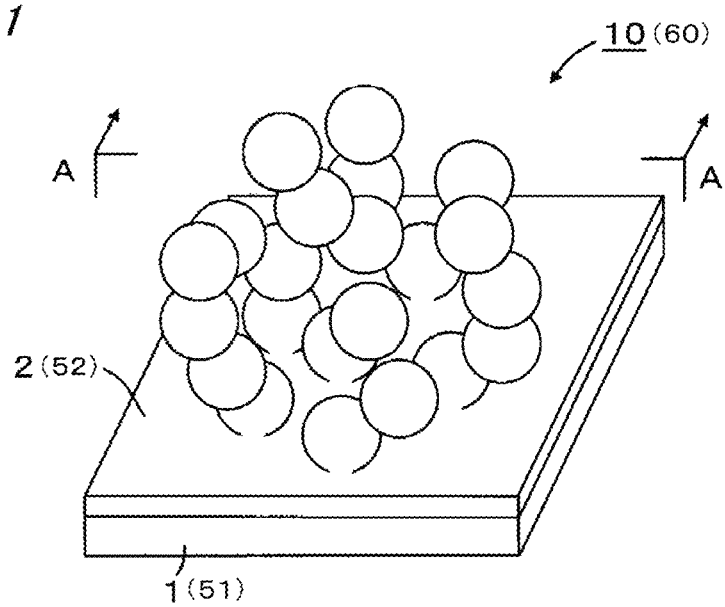
FIG. 1 is a perspective view showing a thermoelectric material according to a first embodiment of the present invention.
Figure 2:
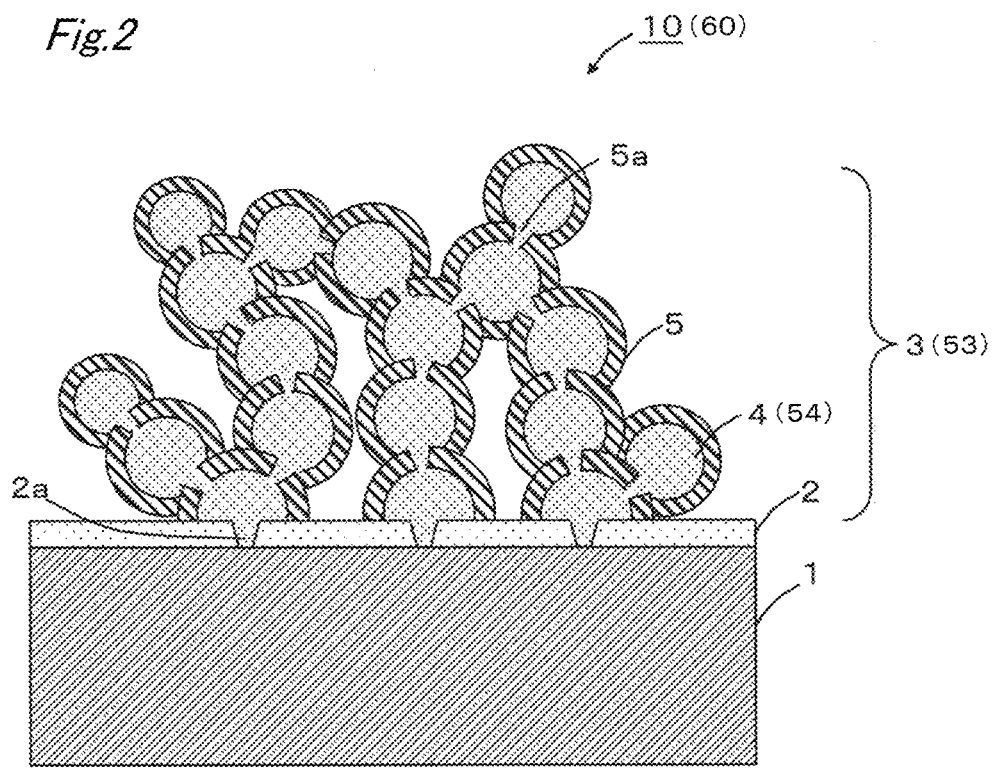
FIG. 2 is a cross-sectional view of FIG. 1 taken along the line A-A.

As shown in FIGS. 1 and 2, the thermoelectric material 10 includes a silicon substrate 1, a silicon oxide film 2 formed on the silicon substrate 1, and a thermoelectric layer 3 provided on the silicon oxide film 2. As the silicon substrate 1, a single crystal silicon substrate is preferably used. The silicon oxide film 2 is preferably an ultrathin oxide film as thick as about a monolayer or bilayer of Si. The thermoelectric layer 3 has such a configuration that a plurality of semiconductor nanodots 4 each surrounded by a potential barrier layer (hereinafter, referred to as the barrier layer) 5 are piled up so as to form a particle packed structure.

The nanodot herein refers to a nanocrystal with a substantially spherical shape or a substantially ellipsoidal shape having a size of a nanometer order. It is to be noted that the nanodot may take a shape which is considerably different from the substantially spherical shape or the substantially ellipsoidal shape depending on a production process. The term "plurality" herein refers to the two or more nanodots being piled up in a vertical direction. For example, when used as a thermoelectric conversion element having an element height of about several tens of μm, the thermoelectric material made of $10^2$ to $10^5$ vertically-piled-up nanodots 4 may be used.

As shown in the cross-sectional view of FIG. 2, the silicon oxide film 2 has an oxide film opening (hereinafter, referred to as the film opening) 2a formed therein. The nanodots 4 are provided on and above the film opening 2a. Furthermore, the barrier layer 5 has a barrier layer opening (hereinafter, referred to as the layer opening) 5a formed therein. At least some of the plurality of nanodots 4 are connected to each other through the layer openings 5a with their crystal orientation aligned. That is, the plurality of nanodots 4 are epitaxially grown and piled up on the silicon oxide film 2.

As described above, the nanodots 4 are piled up so as to form the particle packed structure. The particle packed structure herein may be a regular packed structure or a random packed structure. Furthermore, some of the nanodots 4 may have the regular packed structure, and others may have the random structure. In order to improve a packing ratio of the nanodots 4 in the thermoelectric layer 3, it is preferable that the nanodots 4 are linearly piled up on the film opening 2a. As shown in FIG. 2, however, a plurality of layer openings 5a may be formed in one barrier layer 5, and the nanodots 4 may be grown dendritically or randomly.

In addition, while voids are formed among the plurality of nanodots 4, the void may contain a part made of material such as silicon generated in a process of producing the thermoelectric material 10.

The nanodots 4 are made of Si, Ge, SiGe, silicide of Mg, silicide of Fe, or silicide of Mn. Chemical formulas of the above silicides are expressed by $Mg_2Si$, $\beta\text{-}FeSi_2$, and $MnSi_x$, respectively. In addition, in order to noticeably improve the quantum effect, the nanodots 4 each have a diameter ranging preferably from 1 nm to 100 nm, or more preferably from 2 nm to 50 nm. In order to improve the electric conductivity σ, the nanodots 4 each have an areal density ranging preferably from $10^9$ cm$^{-2}$ to $10^{13}$ cm$^{-2}$, or more preferably $10^{11}$ cm$^{-2}$ or more. In order to maintain the improved electric conductivity σ, it is preferable that the nanodots 4 are substantially uniform in size.

The barrier layer 5 is made of material having a bandgap larger than that of the material of the nanodots 4. For example, when the nanodots 4 are made of Si, the barrier layer 5 may be made of $SiO_2$. When the nanodots 4 are made of Ge, SiGe or silicide, the barrier layer 5 may be made of Si or SiGe. When the barrier layer 5 is made of above material other than $SiO_2$, a surface oxide layer (not shown) made of $SiO_2$ is to be formed on an uppermost surface of the barrier layer 5. In order to sufficiently fulfill the thermoelectric characteristics of the material of the nanodots 4, the barrier layer 5 preferably has a thickness of 3 nm or less.

Figure 3A:
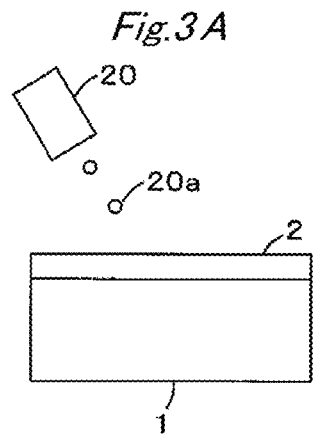
Figure 3B:
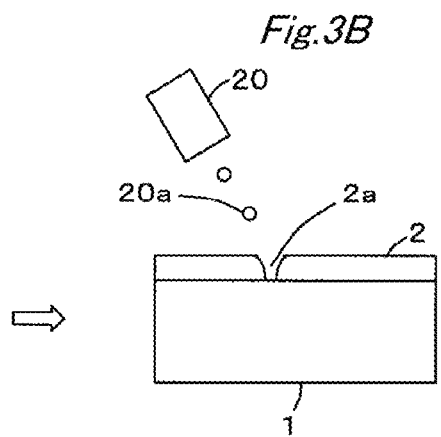

With reference to FIGS. 3A and 3B, discussions will be made to a method for producing the thermoelectric material 10 according to the first embodiment of the present invention in a case where the nanodots 4 are made of Si.

The method for producing the thermoelectric material 10 includes a preparing step S1 of preparing the silicon substrate 1, an oxidizing step S2 of oxidizing a substrate surface of the silicon substrate 1 to form the silicon oxide film 2, an opening step S3 of forming the film openings 2a in the silicon oxide film 2, and a growing step S4 of epitaxially growing to pile up the nanodots 4 made of Si on the film openings 2a.

In the oxidizing step S2, the surface of the silicon substrate 1 is oxidized under a condition of low oxygen partial pressure and high temperature such as an oxygen partial pressure of $2\times10^{-4}$ Pa and a temperature of 600° C., whereby the silicon oxide film 2 as thick as a monolayer or bilayer is formed.

Then, in the opening step S3, the silicon oxide film 2 is irradiated with a molecular beam of Si 20a generated by a silicon evaporation source 20 shown in FIG. 3A under a condition of high vacuum (such as $10^{-5}$ Pa or less) and about 500° C. or more. Thus, the silicon oxide film 2 disappears and SiO sublimes to form the film opening 2a as shown in FIG. 3B through a reaction shown in the following formula (1).

$$Si + SiO_2 \rightarrow 2SiO\uparrow \quad (1)$$

Figure 4A:
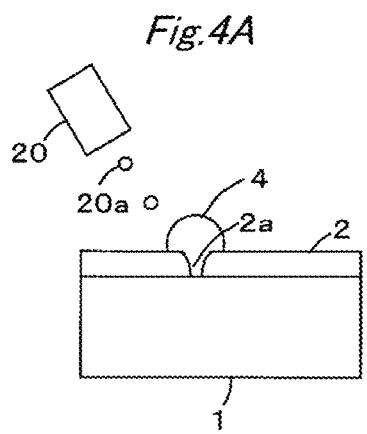

Then, in the growing step S4, as shown in FIG. 4A, the silicon oxide film 2 is irradiated with the molecular beam of Si 20a. Then, Si atoms are deposited to a Si dangling bond in the surface of the silicon substrate 1 which has been exposed after the formation of the film opening 2a, whereby the nanodots 4 are created.

Figure 4B:
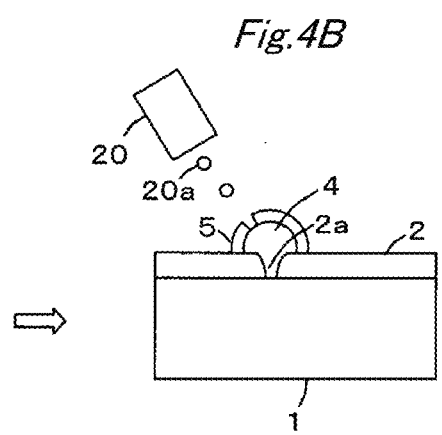

Then, the irradiation of the molecular beam of Si 20a is stopped, and the nanodots 4 made of Si are oxidized, whereby the barrier layer 5 made of $SiO_2$ is provided around each of the nanodots 4. Then, as shown in FIG. 4B, similarly to the formation of the film opening 2a, the irradiation of the molecular beam of Si 20a is started again to form the layer opening 5a according to the above formula (1). At this step, the layer opening 5a may be formed in the same vacuum condition and temperature condition as those of the opening step S3 of forming the film opening 2a, or may be formed under different vacuum condition and temperature condition in view of the size and/or composition of the barrier layer 5, for example.

Figure 4C:
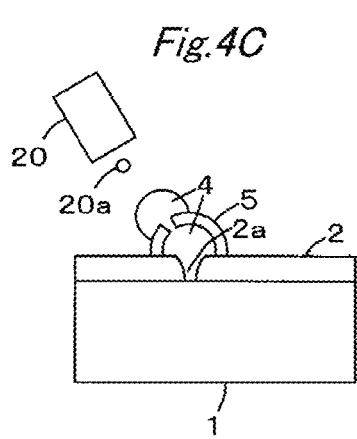

Finally, as shown in FIG. 4C, the Si atoms are deposited on the layer opening 5a, whereby a new nanodot 4 is created. At this time, many of the nanodots 4 are connected to each other through the layer openings 5a with their crystal orientation aligned. That is, by repeating the processes shown in FIGS. 4A to 4C, the plurality of nanodots 4 are epitaxially grown and piled up on and above the film openings 2a formed in the silicon oxide film 2.

The opening step S3 and the growing step S4 have been separately described. When the nanodots 4 are created with Si, however, the formation of the film opening 2a in the opening step S3, and the creation of the nanodots 4 in the growing step S4 are to be continuously performed by irradiating the silicon oxide film 2 with the molecular beam of Si 20a.

The film opening 2a is formed by the irradiation of the molecular beam of Si 20a in this embodiment, but it may be formed by irradiation of a molecular beam of Ge generated by a germanium evaporation source (not shown). In the latter case, the silicon oxide film 2 disappears and SiO and GeO sublime to form the film opening 2a through a reaction shown in the following formula (2).

$$Ge + SiO_2 \rightarrow SiO\uparrow + GeO\uparrow \qquad (2)$$

Figure 5:
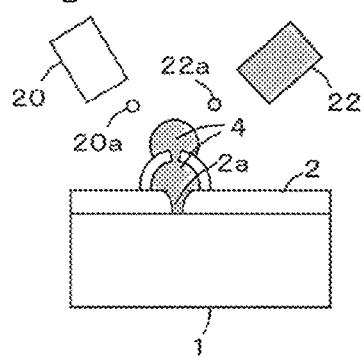
FIG. 5 is an illustration showing a step of creating nanodots made of silicide.

Discussions have been made to the case where the nanodots 4 are made of Si in this embodiment. When the nanodots 4 are made of SiGe, silicide, etc., the opening step S3 and the growing step S4 are performed with a plurality of evaporation sources. For example, when the nanodots 4 are made of iron silicide, the film opening 2a is formed with the molecular beam of Si 20a generated by the silicon evaporation source 20, as shown in FIG. 5. Then, the nanodots 4 made of iron silicide can be created by irradiation of the molecular beam of Si 20a and a molecular beam of Fe 22a generated by an iron evaporation source 22, at an atmospheric temperature of 250° C. to 600° C., for example. The nanodots made of manganese silicide or magnesium silicide can be created under the same condition.

Furthermore, after the creation of the nanodots 4, the barrier layer 5 made of desired material can be provided by irradiation of the molecular beam of the material such as Si, SiGe, silicide or the like. Thus, when the barrier layer 5 is made of material other than $SiO_2$, the barrier layer 5 is oxidized to form a surface oxide layer made of $SiO_2$ on its surface, and then as described above, the molecular beam of Si 20a (molecular beam of Ge) is applied, whereby the layer opening 5a is formed according to the above formula (1) or (2).

Figure 6A:
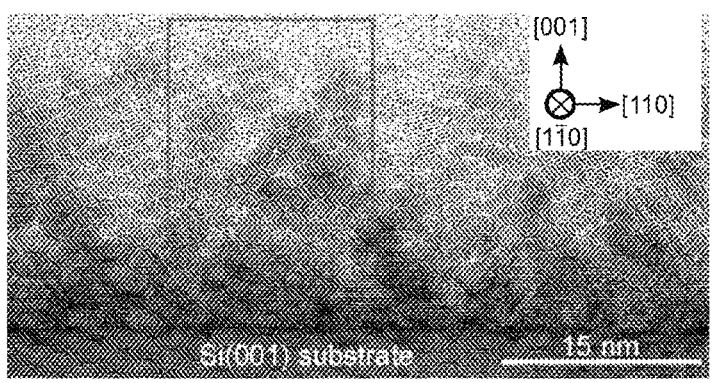
FIG. 6A is a high-resolution cross-sectional TEM image of epitaxially grown Si nanodots.
Figure 6B:
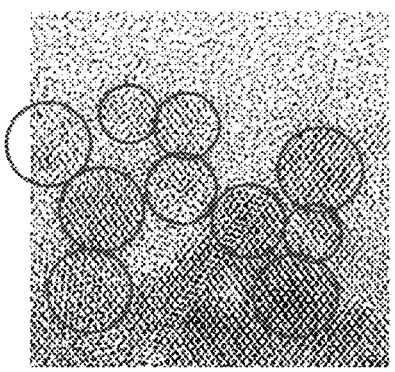
FIG. 6B is an enlarged view of an area surrounded by the square in FIG. 6A.

FIG. 6A is a high-resolution cross-sectional TEM image of the thermoelectric layer part of the thermoelectric material produced by the above method, which shows a cross-sectional surface of the Si nanodots epitaxially grown on the single crystal silicon substrate. The nanodots were created so as to form a diameter of about 3 nm. The barrier layer made of $SiO_2$ is as thick as the monolayer or bilayer, that is, its thickness is less than 1 nm, so that it is not visible in FIG. 6A. Meanwhile, as shown in FIG. 6B which is an enlarged view of an area surrounded by the square in FIG. 6A, it is found that substantially sphere-shaped nanodots made of Si are created in the circled areas. Furthermore, it is found that voids are generated among the circled areas, and the nanodots are spread randomly and piled up.

The thermal conductivity k of the thermoelectric material produced as described above was measured by the 2ω method. In the 2ω method, a voltage having a frequency ω is applied to the thermoelectric material, generated Joule heat changes at a frequency of 2ω, and therefore, an electric resistance value of the thermoelectric material also changes at the frequency of 2ω. According to this principle, amplitude of an output voltage was measured to obtain the thermal conductivity k.

As a result, the thermal conductivity k showed a very small value such as k=0.67±0.11 W/mK. When comparing this value with the thermal conductivity k of bulk Si of about 150 W/mK, it is found that the value of thermal conductivity k of the thermoelectric layer, which is made of the nanodots piled up as in the case of this embodiment, is considerably reduced. Furthermore, it is generally known that when the material is to be made amorphous, phonon scattering is increased, and the value of the thermal conductivity k is minimized. The value of the thermal conductivity k of the thermoelectric material produced by the production method according to this embodiment is considerably smaller than the thermal conductivity of 2.0 W/mK of amorphous silicon.

In this embodiment, the thermoelectric material 10 including the thermoelectric layer 3 having the plurality of nanodots 4, and the method for producing the same have been described. According to this embodiment where thermoelectric layer 3 includes the plurality of nanodots 4, the increase of the phonon scattering due to the nanostructure reduces the thermal conductivity k. Especially, when the nanodots 4 are made of Si, the problematic thermal conductivity k can be considerably reduced as can be seen from the result of the 2ω method.

In addition, at least some of the nanodots 4 are connected with their crystal orientation aligned, thereby improving the electric conductivity σ. The quantum effect can be obtained due to the nanostructure, thereby increasing the power factor $S^2\sigma$. As a result, the performance index ZT is considerably increased, and thus the thermoelectric material 10 which is superior in thermoelectric performance can be provided.

According to the semiconductor device disclosed in patent document 1, a spacer layer is provided and thus a proportion of the material of the spacer layer to the material of the nanodots is high (refer to FIG. 10). Therefore, the thermoelectric characteristics of the material of the nanodots are not sufficiently fulfilled. Meanwhile, this embodiment in which the nanodots 4 are piled up, and in which the barrier layer 5 is provided around each of the nanodots 4, leads to the high proportion of the material of the nanodots 4, and the superior thermoelectric characteristics of the material can be implemented due to the nanostructure.

In addition, the nanodots 4 are each provided on the film opening 2a formed in the silicon oxide film 2, which results in the nanodots 4 epitaxially growing across the amorphous structure of $SiO_2$ which increases the phonon scattering.

Furthermore, the nanodots 4 each have the barrier layer 5 having the thickness of 10 nm or less, that is, as thick as several atomic layers around its periphery, and are connected to other nanodots 4 through the layer opening 5a formed in the barrier layer 5. This structure can be created by continuous irradiation of the molecular beam, thereby simplifying the production process of the thermoelectric material 10.

In the above, the case where the film opening 2a is formed in the silicon oxide film 2 on the silicon substrate 1 has been described, but even when a semiconductor oxide film is formed on a semiconductor substrate other than the silicon substrate, the thermoelectric material having the same structure as the thermoelectric material 10 in this embodiment can be obtained by forming an opening in this oxide film. The semiconductor oxide film may be a $Si_xGe_yO_z$ film formed by oxidizing a SiGe mixed crystal substrate, a $GeO_x$ film formed by oxidizing a Ge substrate, and the like. When the molecular beam of Si is used, the opening is formed through reactions expressed by the following formulas (3) and (4).

$$Si_xGe_yO_z + aSi \rightarrow bSiO\uparrow + cGeO\uparrow \quad (3)$$

$$GeO_x + dSi \rightarrow eSiO\uparrow + GeO\uparrow \quad (4)$$

When a molecular beam of Ge is used, the opening is formed through reactions expressed by the following formulas (5) and (6).

$$Si_xGe_yO_z + fGe \rightarrow gSiO\uparrow + hGeO\uparrow \quad (5)$$

$$GeO_x + iGe \rightarrow jGeO\uparrow \quad (6)$$

The factors a to j are determined by x, y and z. The opening can also be formed in an oxide film formed by oxidizing a silicide expressed by the chemical formula of $SiFe_xO_y$.

Furthermore, the case where the substrate made of semiconductor is used as the substrate of the thermoelectric material 10 has been described, but the semiconductor substrate may be provided such that a semiconductor thin film is deposited on a glass substrate by electron beam heating or the like. Alternatively, another semiconductor thin film may be formed on the silicon substrate or the like.

Second Embodiment

A thermoelectric material 60 according to a second embodiment of the present invention will be described with reference to FIG. 1, etc. used in the description of the first embodiment.

In the growing step S4 of the method for producing the thermoelectric material according to the first embodiment, the irradiation is executed with the molecular beam of the material such as Si, Ge, SiGe, or silicide of the nanodots 4 (refer to FIGS. 4A to 4C). Meanwhile, in the growing step S4 according to this embodiment, irradiation is executed with a molecular beam of a dopant, that is, a donor atom or acceptor atom, in addition to the molecular beam of the material of nanodots 54. As a result, the nanodots 54 of the thermoelectric layer 53 are doped, and the thermoelectric material 60 serves as a p-type semiconductor or an n-type semiconductor. Other than the above, a configuration of the thermoelectric material 60 and steps of a method for producing the thermoelectric material 60 are the same as those of the first embodiment, and the same reference symbol is given thereto and their description is omitted.

When the nanodots 54 are made of Si or Ge, the acceptor atom may include boron, aluminum, gallium and indium, while the donor atom may include phosphor, arsenic and antimony, for example. When the nanodots 54 are made of the material other than Si and Ge, the acceptor atom or the donor atom may include the well-known material for the person skilled in the art.

Figure 7:
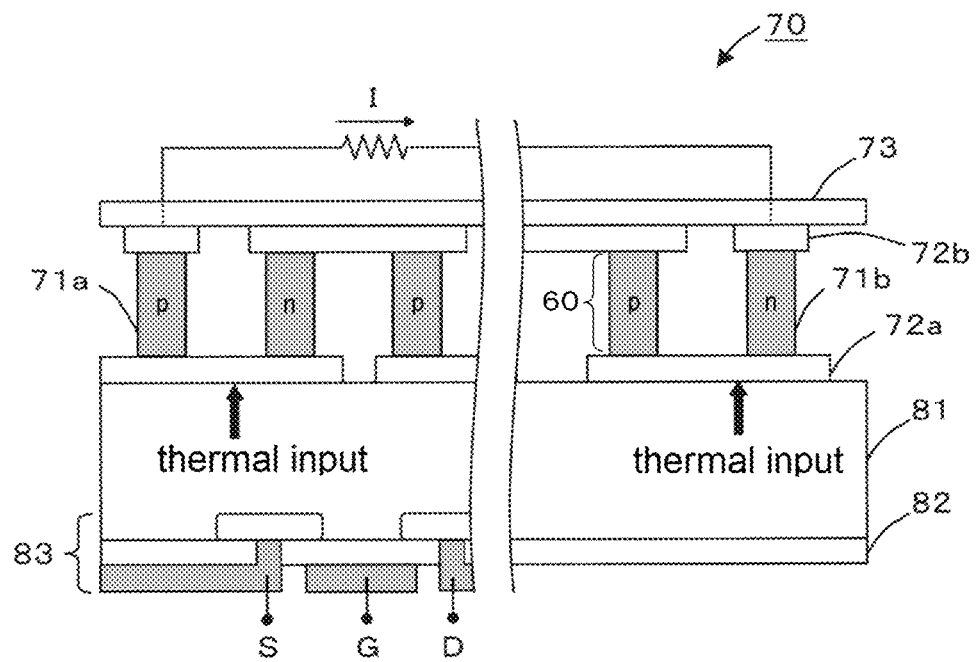
FIG. 7 is a schematic view showing a thermoelectric conversion module according to a second embodiment of the present invention.

FIG. 7 is a schematic view showing a thermoelectric conversion module 70 according to the second embodiment of the present invention. The thermoelectric conversion module 70 includes a thermoelectric conversion element using the thermoelectric material 60. The thermoelectric conversion module herein refers to an assembly of the plurality of thermoelectric conversion elements.

As shown in FIG. 7, the thermoelectric conversion module 70 has the thermoelectric conversion elements, that is, p-type thermoelectric elements 71a and n-type thermoelectric elements 71b alternately arranged between electrodes 72a and 72b. The electrode 72a is provided on a module face of a silicon substrate 81, and the electrode 72b has an electric insulating material 73 such as a ceramic plate provided thereon.

Figure 8:
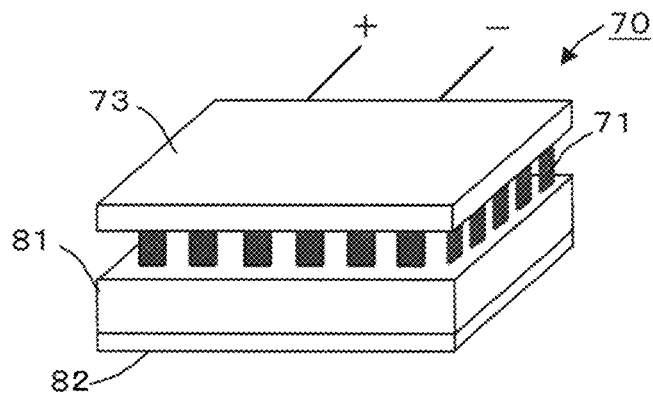
FIG. 8 is a perspective view showing the thermoelectric conversion module according to the second embodiment of the present invention.

In FIG. 7, the thermoelectric conversion module 70 appears to be arranged in a two-dimensional manner for convenience, but the thermoelectric conversion module 70 is actually arranged in a three-dimensional manner as shown in FIG. 8. In FIG. 8, the electrodes 72a and 72b are not shown.

The face opposite to the module face, on which the thermoelectric conversion module 70 is provided, has a silicon oxide film 82 formed thereon. The silicon oxide film 82 has a semiconductor device 83 such as MOSFET (refer to FIG. 7) provided thereon.

The thermoelectric conversion module 70 thermoelectrically converts joule heat generated by an operation of the semiconductor device 83 and transmitted to the module face of the silicon substrate 81.

As shown in FIG. 7, the p-type and n-type thermoelectric elements 71a and 71b are electrically connected in series. The thermoelectric material 60 created through the doping as described above can be used as the p-type and n-type thermoelectric elements 71a and 71b.

The electrode 72a can be provided such that a metal such as aluminum is deposited on the semiconductor substrate 81, and then subjected to a photolithography step. In general, since the deposition of the metal and the photolithography step are included in forming the semiconductor device 83, the electrode 72a can be provided at the same time as the formation of the device 83. The p-type and n-type thermoelectric elements 71a and 71b are bonded to the electrodes 72a and 72b so as to be electrically connected in series. In this way, the thermoelectric conversion module 70 is provided on the module face of the silicon substrate 81. Furthermore, bonding members may be interposed between the p-type and n-type thermoelectric elements 71a and 71b and the electrodes 72a and 72b.

Figure 9:
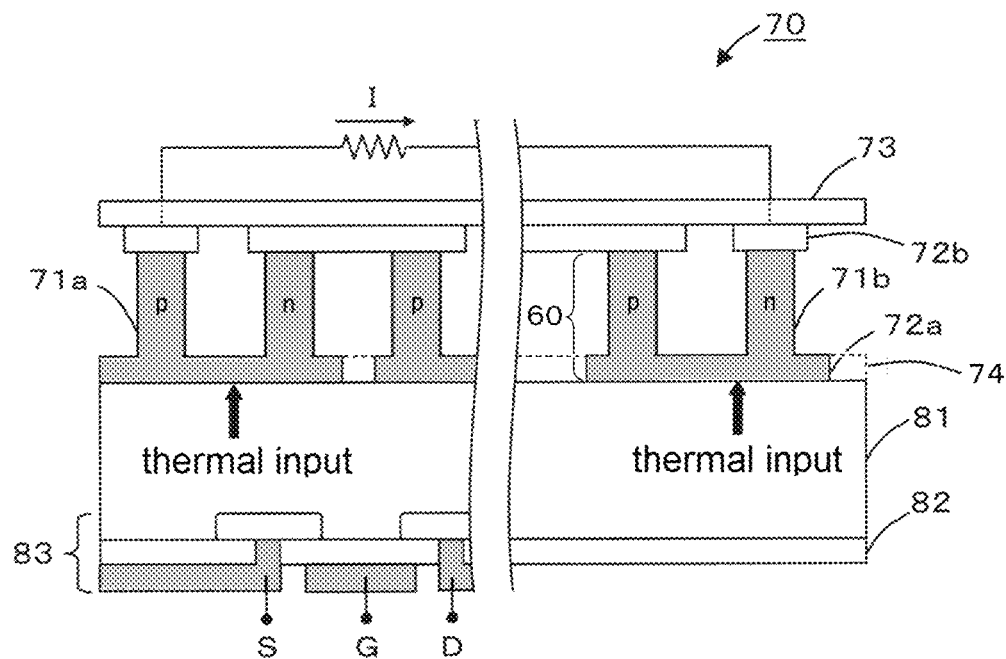
FIG. 9 is a schematic view corresponding to FIG. 7 showing an alternative configuration of the thermoelectric conversion module.

Meanwhile, FIG. 9 shows an alternative configuration of the thermoelectric conversion module 70 according to this embodiment. According to this configuration, a conductive layer 74 is formed on an upper face of the silicon substrate 81 by highly doping an impurity such as aluminum by thermal diffusion, and then, the electrode 72a is formed through an etching step as shown in FIG. 9. Then, a silicon oxide film (not shown) is formed on the electrode 72a by oxidizing the electrode 72a, which is followed by the above-described opening step S3 and the growing step S4. Thus, the thermoelectric material 60, of which the p-type and n-type thermoelectric elements 71a and 71b and the electrode 72a are made, is provided on the silicon substrate 81.

As described above, according to this embodiment, the nanodots 54 of the thermoelectric material 60 have the acceptor atom or the donor atom, so that the thermoelectric material 60 can be used as the p-type and n-type thermoelectric elements 71a and 71b in the thermoelectric conversion module 70.

When the thermoelectric conversion module 70 is provided on a reverse surface of the semiconductor device 83 such as an LSI, exhaust heat generated from the semiconductor device 83 is converted to electric energy by the thermoelectric conversion module 70. This leads to the advantage that it is not necessary to consume power to cool down the semiconductor device 83 to prevent the temperature from rising due to the exhaust heat, and further the exhaust heat can be effectively used, so that energy efficiency can be considerably enhanced in an entire system.

Furthermore, according to the alternative configuration shown in FIG. 9, the step of bonding the p-type and n-type thermoelectric elements 71a and 71b can be omitted, and the formation of the thermoelectric module 70 can be completely combined in the formation of the semiconductor device 83, so that the thermoelectric module 70 can be easily and efficiently provided.

Discussions have been made to the case where the p-type and n-type semiconductors of the thermoelectric material 60 produced in this embodiment are used as the thermoelectric power-generating module, but they can be used as a Peltier module based on similar configurations.

For example, two thermoelectric modules 70 according to this embodiment can be laminated on the reverse surface (module face) of the LSI, the first module (closer to the LSI) as the Peltier module, while the second module as the thermoelectric power-generating module. When the Peltier module is operated, the LSI side of this module is cooled down and its opposite side is heated to high temperature. This heat is transferred to the thermoelectric power-generating module to generate power. Similarly to other instances, this enables the improvement of the energy efficiency of an entire system with the effective use of exhaust heat.

In addition, when the thermoelectric material 10 or 60 according to the present invention is produced with the silicon substrate 1 provided by crystallizing a surface of a polycrystalline silicon substrate, for example, the thermoelectric material 10 or 60 can be suitably used in producing a solar battery.

INDUSTRIAL APPLICABILITY

The thermoelectric material according to the present invention can be widely used in producing a thermoelectric conversion element for mutually converting thermal energy and electric energy, a light emitting element such as a laser, and a solar battery.

DESCRIPTION OF REFERENCE SYMBOLS 1 silicon substrate
2 silicon oxide film
2a oxide film opening (first nano-opening)
3 thermoelectric layer
4 nanodot(s)
5 barrier layer
5a barrier layer opening (second nano-opening)
10, 60 thermoelectric material
20 silicon evaporation source
22 iron evaporation source
70 thermoelectric conversion module
83 semiconductor device

The invention claimed is:

1. A thermoelectric material comprising:
a semiconductor substrate;
a semiconductor oxide film formed on the semiconductor substrate having a plurality of first nano-openings extending through the semiconductor oxide film; and
a thermoelectric layer formed on the semiconductor oxide film in a form of a particle packed structure, including a plurality of first and second semiconductor nanodots, wherein each of the first and second semiconductor nanodots has a circumference covered by first and second potential barrier layers except second and third nano-openings, respectively; wherein
the first semiconductor nanodots are connected to the semiconductor substrate through the first nano-openings and the second semiconductor nanodots are connected to the first semiconductor nanodots through the second nano-openings, so that crystal orientations of the semiconductor substrate and the first and second semiconductor nanodots are aligned.

2. The thermoelectric material according to claim 1, wherein each of the semiconductor nanodots is made of material selected from the group consisting of Si, Ge, SiGe, silicon based compound of Mg, silicon based compound of Fe, and silicon based compound of Mn.

3. The thermoelectric material according to claim 1, wherein each of the potential barrier layers is made of $SiO_2$.

4. The thermoelectric material according to claim 1, wherein each of the potential barrier layers is made of Si, and has an oxide layer made of $SiO_2$ on its surface.

5. The thermoelectric material according to claim 1, wherein each of the semiconductor nanodots has a diameter ranging from 2 nm to 50 nm.

6. The thermoelectric material according to claim 1, wherein each of the semiconductor nanodots has an areal density of $10^{11}$ $cm^{-2}$ or more.

7. The thermoelectric material according to claim 1, wherein each of the potential barrier layers has a thickness of 3 nm or less.

8. The thermoelectric material according to claim 1, wherein each of the semiconductor nanodots contains a p-type or n-type dopant.

9. A thermoelectric conversion module provided with p-type and n-type thermoelectric elements alternately arranged and electrically connected in series, wherein
the p-type and n-type thermoelectric elements each comprise the thermoelectric material according to claim 8, and are provided on a principal surface opposite to a principal surface of the semiconductor substrate having a semiconductor device.

10. The thermoelectric material according to claim 1, wherein each of the semiconductor nanodots has a substantially spherical shape or a substantially ellipsoidal shape.

11. The thermoelectric material according to claim 1, wherein the thermoelectric layer is formed in a form of a random particle packed structure.

12. The thermoelectric material according to claim 1, wherein the thermoelectric layer further includes a plurality of third nanodots, each of which has a circumference covered by a third potential barrier layer except a fourth nano-opening, and the third semiconductor nanodots are connected to the second semiconductor nanodots through the third nano-openings, so that crystal orientations of the semiconductor substrate and the first through third semiconductor nanodots are aligned.

* * * * *